United States Patent
Cheng et al.

(10) Patent No.: US 9,385,218 B1
(45) Date of Patent: Jul. 5, 2016

(54) METHOD AND STRUCTURE FOR FORMING DIELECTRIC ISOLATED FINFET WITH IMPROVED SOURCE/DRAIN EPITAXY

(71) Applicant: INTERNATIONAL BUSINESS MACHINES CORPORATION, Armonk, NY (US)

(72) Inventors: Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/694,562

(22) Filed: Apr. 23, 2015

(51) Int. Cl.
*H01L 29/786* (2006.01)
*H01L 29/66* (2006.01)
*H01L 29/78* (2006.01)
*H01L 29/10* (2006.01)

(52) U.S. Cl.
CPC ...... *H01L 29/66795* (2013.01); *H01L 29/1083* (2013.01); *H01L 29/6653* (2013.01); *H01L 29/66492* (2013.01); *H01L 29/66537* (2013.01); *H01L 29/785* (2013.01); *H01L 29/7848* (2013.01); *H01L 2029/7858* (2013.01)

(58) Field of Classification Search
CPC .................... H01L 29/66795; H01L 29/1083; H01L 29/66492; H01L 29/6653; H01L 29/66537; H01L 29/7848; H01L 29/785; H01L 2029/7858
USPC ....................................................... 257/349
See application file for complete search history.

(56) References Cited

U.S. PATENT DOCUMENTS

| | | | |
|---|---|---|---|
| 7,101,763 B1 | 9/2006 | Anderson et al. | |
| 7,265,031 B2 | 9/2007 | Oh et al. | |
| 7,696,568 B2 | 4/2010 | Hwang et al. | |
| 7,800,152 B2 | 9/2010 | Zhu et al. | |
| 8,492,235 B2 | 7/2013 | Toh et al. | |
| 8,637,372 B2 | 1/2014 | Liu et al. | |
| 8,975,129 B1 * | 3/2015 | Shieh ............... | H01L 21/3086 438/199 |
| 2013/0126972 A1 * | 5/2013 | Wang ............ | H01L 21/823821 257/351 |
| 2014/0175561 A1 * | 6/2014 | Colinge ............ | H01L 29/785 257/401 |
| 2014/0191321 A1 | 7/2014 | Cheng et al. | |
| 2014/0264591 A1 | 9/2014 | Wang et al. | |
| 2014/0264594 A1 | 9/2014 | Adam et al. | |

(Continued)

OTHER PUBLICATIONS

Jurczak, M. et al., "Silicon-on-Nothing (SON)—an innovative process for advanced CMOS," IEEE Transactions on Electron Devices, vol. 47, No. 11, 2000, pp. 2179-2187.

*Primary Examiner* — Jessica Stultz
*Assistant Examiner* — Vu A Vu
(74) *Attorney, Agent, or Firm* — Scully, Scott, Murphy & Presser, P.C.; Louis J. Percello, Esq.

(57) ABSTRACT

A semiconductor structure is provided that includes a fin structure of, from bottom to top, a semiconductor punch through stop (PTS) doping fin portion, a dielectric material fin portion, and a topmost semiconductor fin portion that is present on a wider semiconductor fin base. A functional gate structure straddles the semiconductor fin structure. Portions of the wider semiconductor fin base that are not located directly beneath the fin structure of the present application and that are not covered by the functional gate structure can be used as an area for epitaxial growth of source/drain structures. The wide semiconductor fin base improves source/drain epitaxy for better dopant incorporation and strain enhancement.

7 Claims, 13 Drawing Sheets

(56) References Cited

U.S. PATENT DOCUMENTS

2015/0084041 A1* 3/2015 Hur ................... H01L 29/7832
257/43

2015/0357468 A1* 12/2015 Zhu ................... H01L 29/66545
257/192

* cited by examiner

METHOD AND STRUCTURE FOR FORMING DIELECTRIC ISOLATED FINFET WITH IMPROVED SOURCE/DRAIN EPITAXY

BACKGROUND

The present application relates to a semiconductor structure and a method of forming the same. More particularly, the present application relates to a semiconductor structure including a semiconductor fin having a wide semiconductor fin base that is isolated from a device channel by a dielectric layer and a method of forming the same. The wide semiconductor fin base improves source/drain epitaxy for better doping incorporation and strain enhancement.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. Bulk FinFETs face scaling challenges due to inferior short-channel control compared with semiconductor-on-insulator (SOI) FinFETs. However, FinFETs formed on SOI substrates are more costly than FinFETs formed on a bulk semiconductor substrate and SOI fabrication requires special foundry support not needed with bulk semiconductor substrates.

Dielectric isolated FinFETs (i.e., forming SOI channel FinFETs) reconciles the concerns on bulk and SOI FinFETs. However, to maximize the channel strain by embedded source/drain (eS/D) epitaxy, the conventional eS/D epitaxy quality is compromised due to the narrow feed seed layer for epitaxial growth. Therefore, there is a need for improving FinFETs with dielectric isolation.

SUMMARY

A semiconductor structure is provided that includes a fin structure of, from bottom to top, a semiconductor punch through stop (PTS) doping fin portion, a dielectric material fin portion, and a topmost semiconductor fin portion that is present on a wider semiconductor fin base. A functional gate structure straddles the semiconductor fin structure. Portions of the wider semiconductor fin base that are not located directly beneath the fin structure of the present application and that are not covered by the functional gate structure can be used as an area for epitaxial growth of source/drain structures. The wide semiconductor fin base improves source/drain epitaxy for better dopant incorporation and strain enhancement.

In one aspect of the present application, a semiconductor structure is provided. In accordance with an embodiment of the present application, the semiconductor structure includes a fin structure of a first width and comprising, from bottom to top, a semiconductor punch through stop (PTS) doping fin portion, a dielectric material fin portion, and a topmost semiconductor fin portion located on a semiconductor fin base having a second width that is greater than the first width of the semiconductor fin structure. A functional gate structure straddles the semiconductor fin structure. An epitaxial source structure is located on exposed portions of the semiconductor fin base and on a first side of the functional gate structure, and an epitaxial drain structure is located on exposed portions of the semiconductor fin base and on a second side of the functional gate structure which is opposite the first side of the functional gate structure.

In another aspect of the present, a method of forming a semiconductor structure is provided. In accordance with the present application, the method includes forming a semiconductor fin stack of, from bottom to top, a semiconductor punch through stop (PTS) doping layer portion, a sacrificial semiconductor material layer portion and a topmost semiconductor material layer portion extending upwards from a remaining portion of a semiconductor PTS doping layer. The semiconductor fin stack has a first width. Next, a sacrificial spacer is formed on opposing sidewall surfaces of the semiconductor fin stack. A remaining portion of the semiconductor PTS doping layer is then etched to provide a semiconductor fin base of a second width and located beneath the semiconductor fin stack, wherein the second width is greater than the first width. Next, the sacrificial spacer is removed from the opposing sidewall surfaces of the semiconductor fin stack. A gate structure is formed straddling the semiconductor fin stack. Next, the sacrificial semiconductor material layer portion of the semiconductor fin stack is completely removed to provide a cavity which cavity is then filled with a dielectric material to provide a dielectric material structure. The exposed portions of the topmost semiconductor material layer portion, the dielectric material structure and the semiconductor PTS doping layer are then removed to provide a fin structure of the first width. Next, an epitaxial source structure is epitaxially grown on exposed portions of the semiconductor fin base and on a first side of the functional gate structure, and an epitaxial drain structure is epitaxtially grown on exposed portions of the semiconductor fin base and on a second side of the functional gate structure which is opposite the first side of the functional gate structure.

DETAILED DESCRIPTION

Figure 1:
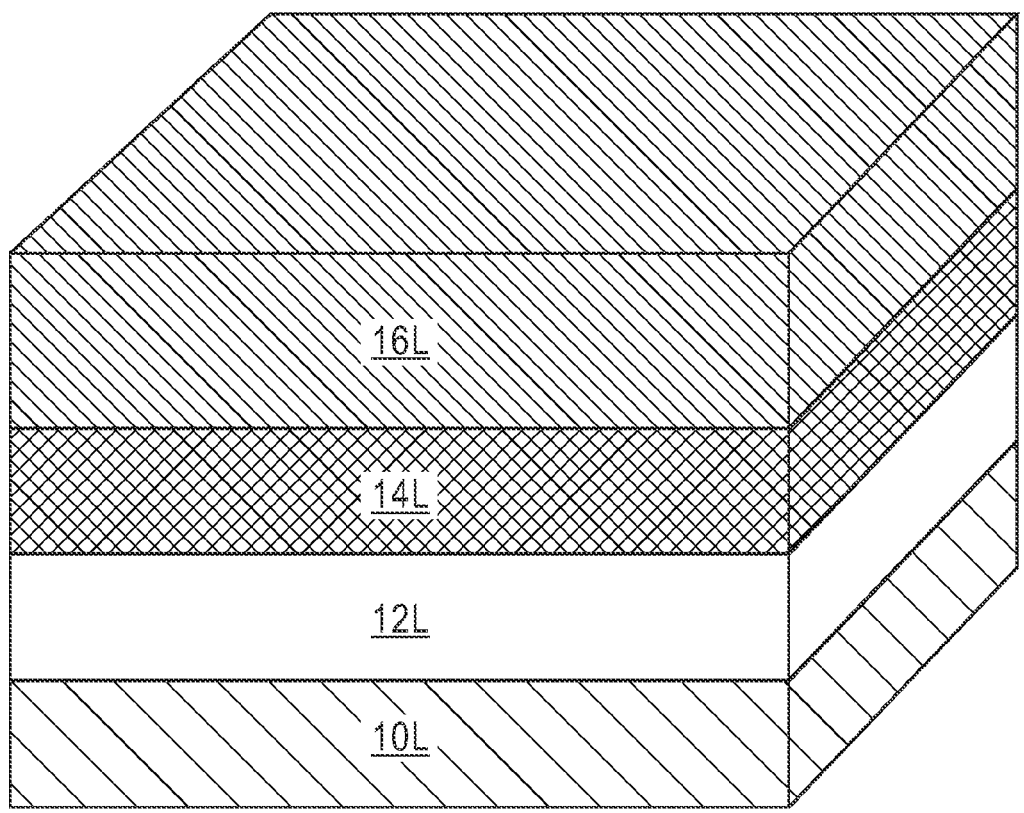
FIG. 1 is a three dimensional view of an exemplary semiconductor structure including, from bottom to top, a semiconductor substrate, a semiconductor punch through stop (PTS) doping layer, a sacrificial semiconductor material layer, and a topmost semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including, from bottom to top, a semiconductor substrate 10L, a semiconductor punch through stop (PTS) doping layer 12L, a sacrificial semiconductor material layer 14L, and a topmost semiconductor material layer 16L that can be employed in accordance with an embodiment of the present application.

The semiconductor substrate 10L may comprise an uppermost portion of a bulk semiconductor substrate or a topmost semiconductor material layer of a semiconductor-on-insulator substrate. The semiconductor substrate 10L comprises a first semiconductor material that has a first lattice constant. The first semiconductor material that can provide the semiconductor substrate 10L may comprise any semiconductor material including, for example, Si, Ge, SiGe, SiC, SiGeC, III-V compound semiconductors or II-VI compound semiconductors. In one embodiment of the present application, the semiconductor substrate 10L is composed of silicon. The first semiconductor material that can provide the semiconductor substrate 10L is typically a single crystalline semiconductor such as, for example, single crystalline silicon. In one embodiment, the first semiconductor material that can provide the semiconductor substrate 10L is non-doped (i.e., an intrinsic semiconductor material).

The semiconductor punch through stop (PTS) doping layer 12L, which is located on a topmost surface of the semiconductor substrate 10L, comprises a second semiconductor material that has a second lattice constant and is of a first conductivity type. The second semiconductor material that can provide the semiconductor PTS doping layer 12L may comprise one of the semiconductor materials mentioned above for the semiconductor substrate 10L. In one embodiment of the present application, the second semiconductor material that can provide the semiconductor PTS doping layer 12L may comprise a same semiconductor material as the first semiconductor material that can provide the semiconductor substrate 10L. In such an embodiment, the second lattice constant of the second semiconductor material matches the first lattice constant of the first semiconductor material. In one example, both the semiconductor PTS doping layer 12L and the semiconductor substrate 10L comprise silicon. In another embodiment of the present application, the second semiconductor material that can provide the semiconductor PTS doping layer 12L may comprise a different semiconductor material than the first semiconductor material that can provide the semiconductor substrate 10L. In such an embodiment, the second lattice constant of the second semiconductor material is different, i.e., lesser than, or greater than, the first lattice constant of the first semiconductor material. In one example, the semiconductor PTS doping layer 12L may comprise Ge and the semiconductor substrate 10L may comprise silicon.

The first conductivity type as mentioned above for the second semiconductor material may include an n-type dopant or a p-type dopant. The term "n-type" denotes an impurity (e.g., dopant) that when added to an intrinsic semiconductor material contributes free electrons to the intrinsic semiconductor material. When the semiconductor PTS doping layer 12L comprises silicon, antimony, arsenic and/or phosphorus may be used as an n-type impurity. The term "p-type" denotes an impurity (e.g., dopant) that when added to an intrinsic semiconductor material creates deficiencies of free electrons in the intrinsic semiconductor material. When the semiconductor PTS doping layer 12L comprises silicon, boron, aluminum, gallium and/or indium may be used a p-type impurity. The concentration of an n-type dopant or a p-type dopant that is present in the semiconductor PTS doping layer 12L is typically from $1 \times 10^{18}$ atoms/cm$^3$ to $1 \times 10^{19}$ atoms/cm$^3$. Other concentrations that are lesser than, or greater than, the aforementioned concentration range may also be used as the concentration of an n-type dopant or a p-type dopant that is present in the semiconductor PTS doping layer 12L. The semiconductor PTS doping layer 12L can have a thickness from 30 nm to 60 nm (below the fin channel). Other thicknesses that are lesser than, or greater than, the aforementioned thickness range may also be employed as thickness of the semiconductor PTS doping layer 12L.

In some embodiments of the present application, the semiconductor PTS doping layer 12L is formed within an upper portion of the semiconductor substrate 10L by introducing n-type or p-type dopants within the upper portion of the semiconductor substrate 10L. In such an embodiment, the dopant can be introduced into the upper portion of the semiconductor substrate 10L either prior to, or after, formation of the overlying sacrificial semiconductor material layer 14L. In embodiments in which the dopant that provides the semiconductor PTS doping layer 12L is introduced into the upper portion of the semiconductor substrate 10L prior to formation of the overlying sacrificial semiconductor material layer 14L, ion implantation or gas phase doping can be used. In embodiments in which the dopant that provides the semiconductor PTS doping layer 12L is introduced into the upper portion of the semiconductor substrate 10L after formation of the overlying sacrificial semiconductor material layer 14L, ion implantation is used. In either embodiment, the semiconductor PTS doping layer 12L has a same crystal orientation as that of the underlying semiconductor substrate 10L.

In other embodiments of the present application, the semiconductor PTS doping layer 12L can be formed utilizing an epitaxial growth, i.e., deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the semiconductor PTS doping layer 12L has an epitaxial relationship, i.e., same crystal orientation, as that of the underlying semiconductor substrate 10L.

Examples of various epitaxial growth processes that are suitable for use in forming the semiconductor PTS doping layer 12L include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of the second semiconductor material that provides the semiconductor PTS doping layer 12L. In some embodiments, the source gas for the deposition of the second semiconductor material that provides the semiconductor PTS doping layer 12L includes a silicon source gas, a germanium source gas or a mixture of a silicon containing gas source and a germanium containing gas source. Carrier gases like hydrogen, nitrogen, helium and argon can be used.

In some embodiments, a dopant can be introduced during the epitaxial growth of the second semiconductor material that provides the semiconductor PTS doping layer 12L. In other embodiments, the dopant can be introduced into the second semiconductor material that provides the semiconductor PTS doping layer 12L after epitaxial growth. In such an embodiment, and as previously described above, the dopant can be introduced either prior to, or after, formation of the overlying sacrificial semiconductor material layer 14L.

The sacrificial semiconductor material layer 14L, which is located on a topmost surface of the semiconductor PTS doping layer 12L, comprises a third semiconductor material that has a third lattice constant. The third semiconductor material that can provide the sacrificial semiconductor material layer 14L comprises one of the semiconductor materials mentioned above for the semiconductor substrate 10L provided that it has a different etch rate than either the semiconductor PTS doping layer 12L and the topmost semiconductor material layer 16L to be subsequently formed. As such, the third lattice constant of the third semiconductor material that provides the sacrificial semiconductor material layer 14L differs from that of the second lattice constant of the second semiconductor material that provides the semiconductor PTS doping layer 12L. In one example, the first and second semiconductor materials that provide the semiconductor substrate 10L and the semiconductor PTS doping layer 12L, respectively, comprise silicon, while the third semiconductor material that provides the sacrificial semiconductor material layer 14L comprises a silicon germanium alloy. In such an embodiment, the germanium content of the silicon germanium alloy may vary from 20 atomic % to 40 atomic %. Other germanium contents that are lesser than, or greater than, the aforementioned germanium content, may also be used.

The sacrificial semiconductor material layer 14L is typically non-doped and is formed utilizing an epitaxial growth process similar to the one mentioned above for forming the semiconductor PTS doping layer 12L. Since an epitaxial growth process is used in forming the sacrificial semiconductor material layer 14L, the sacrificial semiconductor material layer 14L has an epitaxial relationship with the underlying PTS doping layer 12L. The sacrificial semiconductor material layer 14L can have a thickness that is from 10 nm to 100 nm. Other thicknesses that are lesser than, or greater than, the aforementioned thickness range may also be employed as thickness of the sacrificial semiconductor material layer 14L.

The topmost semiconductor material layer 16L, which is located on a topmost surface of the sacrificial semiconductor material layer 14L, comprises a fourth semiconductor material that has a fourth lattice constant. The fourth semiconductor material that can provide the topmost semiconductor material layer 16L comprises one of the semiconductor materials mentioned above for the semiconductor substrate 10L provided that it has a different etch rate than sacrificial semiconductor material layer 14L. As such, the fourth lattice constant of the fourth semiconductor material that provides the topmost semiconductor material layer 16L differs from that of the third lattice constant of the third semiconductor material that provides the sacrificial semiconductor material layer 14L. The fourth semiconductor material that provides the topmost semiconductor material layer 16L may be the same as that of the first and/or second semiconductor material. In one example, the first, the second and the fourth semiconductor materials that provide the semiconductor substrate 10L, the semiconductor PTS doping layer 12L and the topmost semiconductor material layer 16L, respectively, comprise silicon, while the third semiconductor material that provides the sacrificial semiconductor material layer 14L comprises a silicon germanium alloy as mentioned above.

The topmost semiconductor material layer 16L is typically non-doped and is formed utilizing an epitaxial growth process similar to the one mentioned above for forming the semiconductor PTS doping layer 12L. Since an epitaxial growth process is used in forming the topmost semiconductor material layer 16L, topmost semiconductor material layer 16L has an epitaxial relationship with the underlying sacrificial semiconductor material layer 14L. The topmost semiconductor material layer 16L can have a thickness from 20 nm to 100 nm. Other thicknesses that are lesser than, or greater than, the aforementioned thickness range may also be employed as thickness of the topmost semiconductor material layer 16L.

In some embodiments (not shown), a blanket layer of a hard mask material can be formed on a surface of the topmost semiconductor material layer 16L. The blanket layer of hard mask material is a contiguous layer that covers the entirety of the topmost semiconductor material layer 16L. The blanket layer of hard mask material that can be employed in the present application may include a semiconductor oxide, a semiconductor nitride and/or a semiconductor oxynitride. In one embodiment, the hard mask material that can be used in the present application can be comprised of silicon dioxide. In another embodiment, the hard mask material that can be used in the present application can be comprised of silicon nitride. In yet another embodiment, the hard mask material that can be used in the present application can include a hard mask stack of, in any order, silicon dioxide and silicon nitride.

Figure 3:
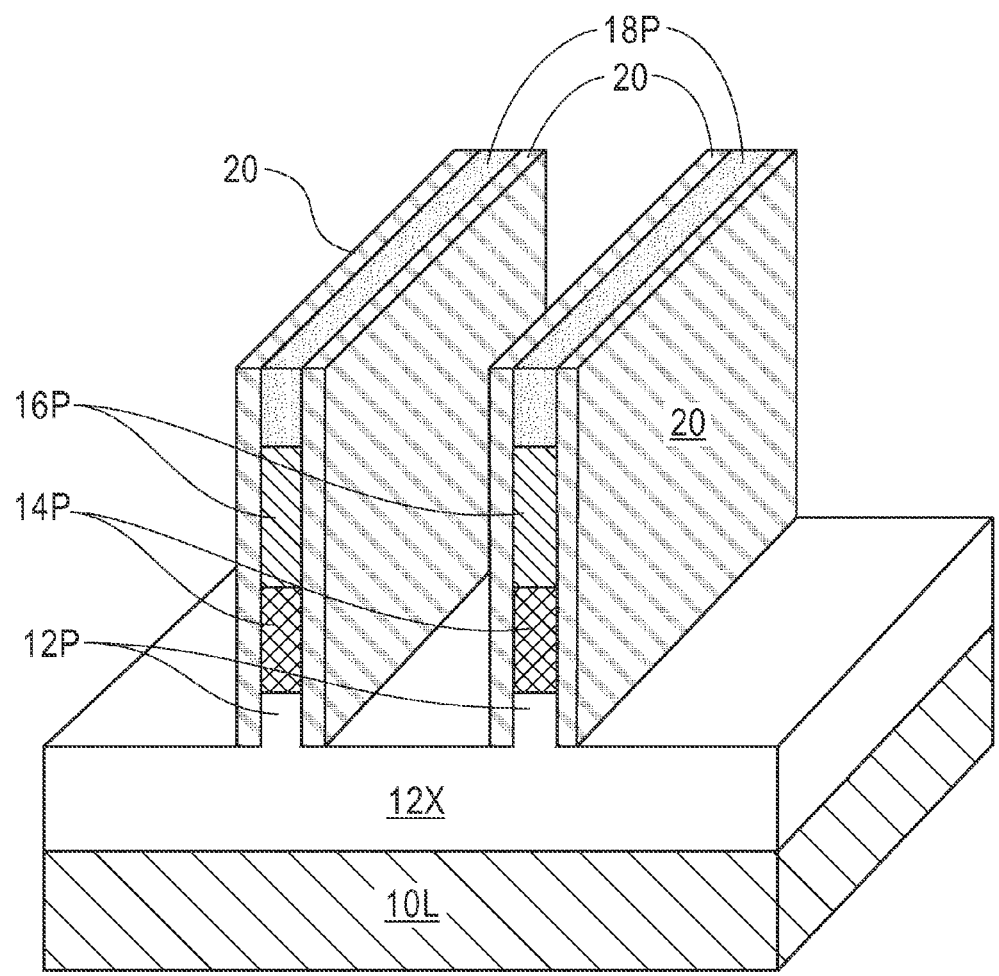
FIG. 3 is a three dimensional view of the exemplary semiconductor structure of FIG. 2 after forming a sacrificial spacer on opposing sidewalls of each semiconductor fin stack.
Figure 4:
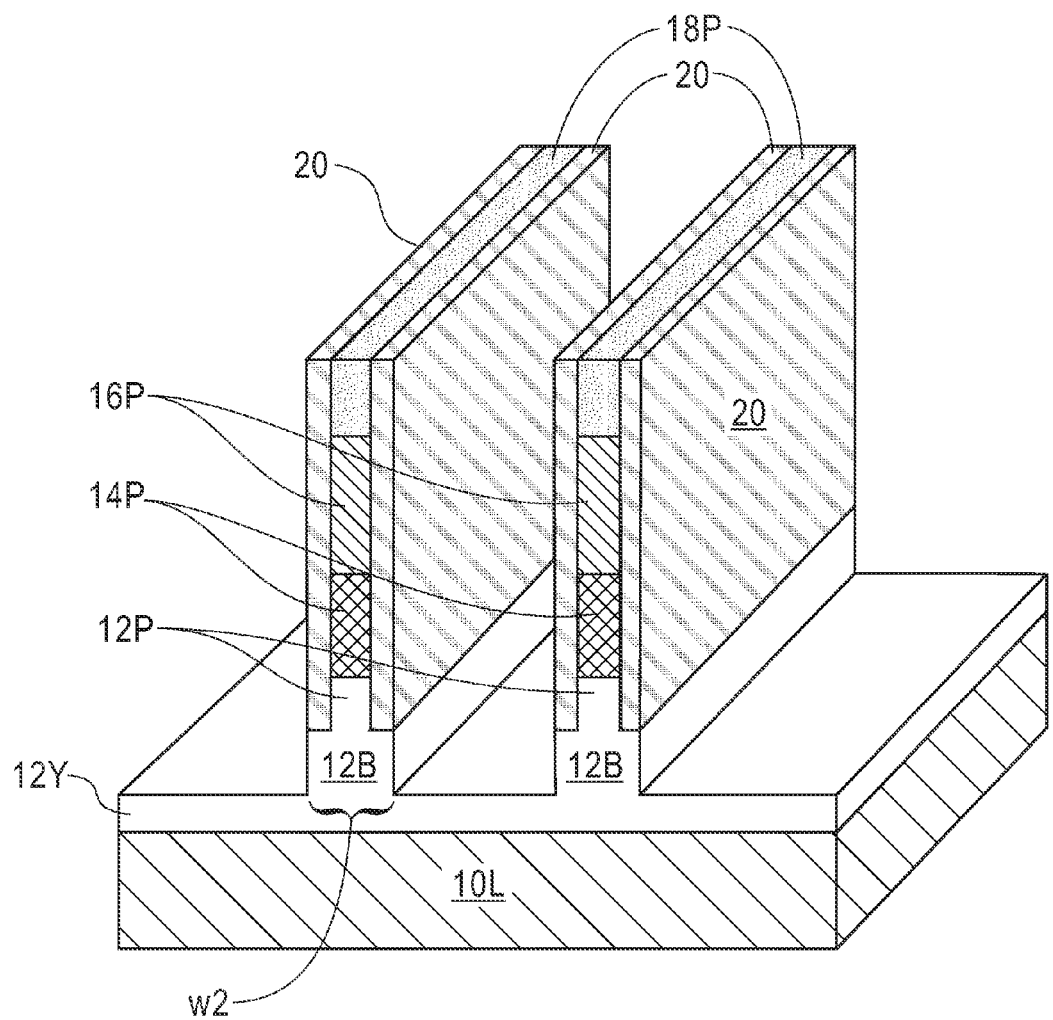
FIG. 4 is a three dimensional view of the exemplary semiconductor structure of FIG. 3 after etching exposed portions of the reduced thickness portion of the semiconductor PTS doping layer to provide a semiconductor fin base having a second width that is greater than the first width utilizing each sacrificial spacer and each semiconductor fin stack as an etch mask.

In some embodiments, the hard mask material that can be used in the present application can be formed by a deposition process such as, for example, chemical vapor deposition (CVD) or plasma enhanced chemical vapor deposition (PECVD). In other embodiments, the hard mask material that can be used in the present application can be formed by a thermal process such as, for example, thermal oxidation and/or thermal nitridation. In yet other embodiments, the hard mask material that can be used in the present application can be formed by a combination of a deposition process and a thermal process. The thickness of the hard mask material that can be used in the present application can range from 2 nm to 10 nm, with a thickness from 3 nm to 6 nm being more typical. The blanket layer of hard mask material is not specifically shown in FIG. 1, but a remaining portion of the same is shown in FIGS. 2-4 that follow.

Figure 2:
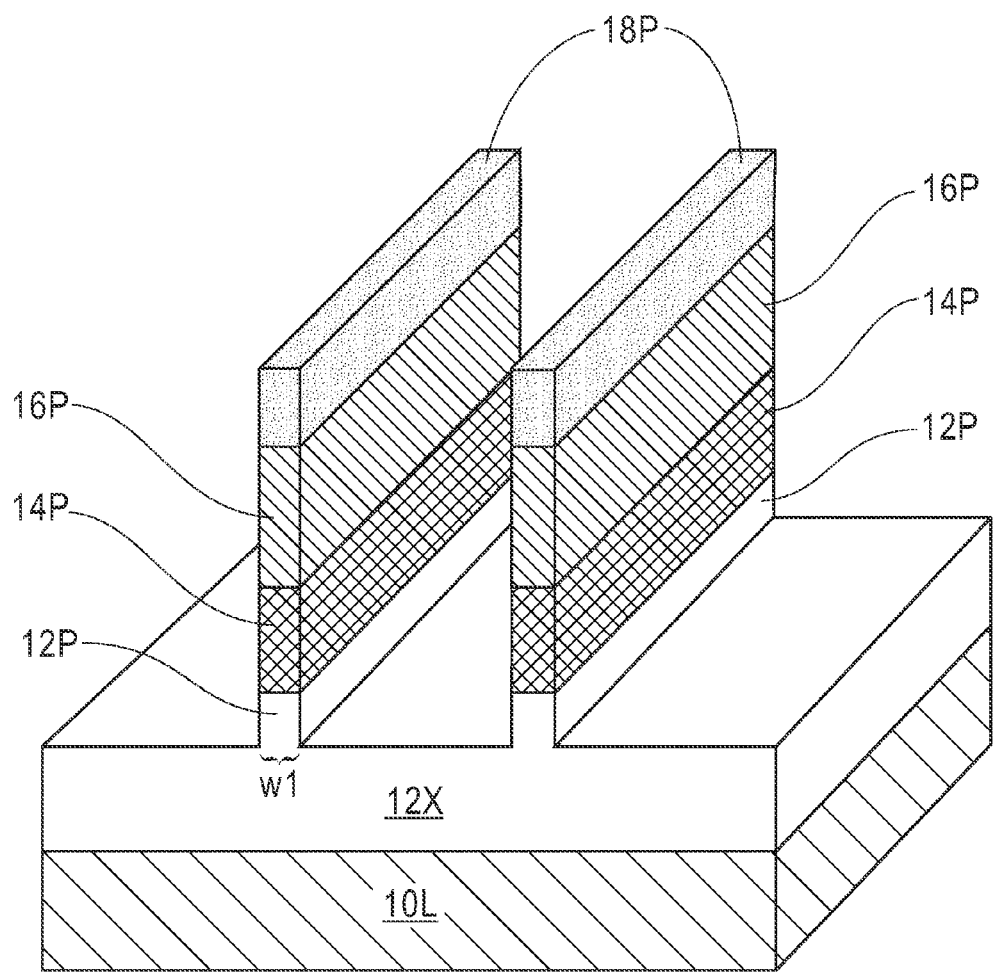
FIG. 2 is a three dimensional view of the exemplary semiconductor structure of FIG. 1 after forming semiconductor fin stacks of a first width that extend from a surface of a reduced thickness portion of the semiconductor PTS doping layer.

Referring now to FIG. 2, there is illustrated the exemplary semiconductor structure of FIG. 1 after forming semiconductor fin stacks (12P, 14P, 16P) of a first width, w1, that extend from a surface of a reduced thickness portion of the semiconductor PTS doping layer 12L. The reduced thickness portion of the semiconductor PTS doping layer 12L is labeled as 12X in the drawings of the present application.

In FIG. 2, each of the semiconductor fin stacks (12P, 14P, 16P) includes a hard mask cap 18P that is located on a topmost surface of the semiconductor fin stack (12P, 14P, 16P). Each hard mask cap 18P represents a remaining portion of the blanket layer of hard mask material that was mentioned above. Each semiconductor fin stack (12P, 14P, 16P) includes a remaining portion of the semiconductor PTS doping layer 12L (hereinafter referred to as PTS doping layer portion 12P), a remaining portion of the sacrificial semiconductor material layer 14L (hereinafter referred to as sacrificial semiconductor material layer portion 14P) and a remaining portion of the topmost semiconductor material layer 16L (hereinafter referred to as topmost semiconductor material layer portion 16P).

As is shown, each material layer portion of the semiconductor fin stack (12P, 14P, 16P) has sidewall surfaces that are vertically coincident to each other. Also, the sidewall surfaces of each semiconductor fin stack (12P, 14P, 16P) are vertically coincident to the sidewall surfaces of the overlying hard mask cap 18P.

Each semiconductor fin stack (12P, 14P, 16P) can be formed by patterning the exemplary semiconductor structure shown in FIG. 1. Prior to patterning the exemplary semiconductor structure shown in FIG. 1, the blanket layer of hard mask material may be formed on the topmost surface of the exemplary semiconductor structure shown in FIG. 1. In one embodiment, the patterning process used to define each semiconductor fin stack (12P, 14P, 16P) and, if present, each hard mask cap 18P, comprises a sidewall image transfer (SIT) process. The SIT process includes forming a contiguous mandrel material layer (not shown) on the topmost surface of the blanket layer of hard mask material, if present, or on the topmost surface of the topmost semiconductor material layer 16L. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each semiconductor fin stack (12P, 14P, 16P).

After formation of the dielectric spacers, the SIT process continues by removing each mandrel structure. Each mandrel structure can be removed by an etching process that is selective for removing the mandrel material as compared to the material of the dielectric spacers and the hard mask material or the topmost semiconductor material layer 16L. Following the mandrel structure removal, the SIT process continues by transferring the pattern provided by the dielectric spacers completely through the blanket layer of hard mask material (if present), the topmost semiconductor material layer 16L, and the sacrificial semiconductor material layer 14L and partially into the semiconductor PTS doping layer 12L. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process used to define each semiconductor fin stack (12P, 14P, 16P) and, if present, each hard mask cap 18P, can include lithography and etching. Lithography includes forming a photoresist material (not shown) on either the blanket layer of hard mask material (if present) or the topmost semiconductor material layer 16L. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

As used herein, a "semiconductor fin stack" refers to a contiguous structure including the semiconductor PTS doping layer portion 12P, sacrificial semiconductor material layer portion 14P and the topmost semiconductor material layer portion 16P, and including a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin stack (12P, 14P, 16P) has a height from 30 nm to 300 nm and a first width, w1, from 4 nm to 30 nm. In another embodiment of the present application, each semiconductor fin stack (12P, 14P, 16P) has a height from 40 nm to 200 nm and a first width, w1, from 5 nm to 12 nm. Each semiconductor fin stack (12P, 14P, 16P) is spaced apart from its nearest neighboring semiconductor fin stack (12P, 14P, 16P) by a pitch of from 20 nm to 80 nm. Also, each semiconductor fin stack (12P, 14P, 16P) is oriented parallel to each other.

Referring now to FIG. 3, there is illustrated the exemplary semiconductor structure of FIG. 2 after forming a sacrificial spacer 20 on opposing sidewalls of each semiconductor fin stack (12P, 14P, 16P). As is shown, each bottommost surface, i.e., base, of each sacrificial spacer 20 is located on a portion of the reduced thickness portion of the semiconductor PTS doping layer 12X. Each sacrificial spacer 20 has a topmost surface that is coplanar with either the topmost surface of the hard mask cap 18P (as shown in FIG. 3) or a topmost surface of the topmost semiconductor material layer portion 16P (not shown).

Each sacrificial spacer 20 may comprise any material that can be removed in a subsequent process step of the present application selective to the various semiconductor materials that provide the exemplary semiconductor structure of FIG. 1. In one embodiment of the present application, each sacrificial spacer 20 may comprise a dielectric spacer material such as, for example, a dielectric oxide, a dielectric nitride and/or a dielectric oxynitride. In such an embodiment, the dielectric material that provides the sacrificial spacer 20 may be a same dielectric material as, or a different dielectric material than, hard mask cap 18P. In one example, each sacrificial spacer 20 comprises silicon dioxide or silicon nitride. Each sacrificial spacer 20 can be formed by first depositing the material that provides the sacrificial spacer 20. Illustrative examples of deposition processes that may be used to provide each sacrificial spacer 20 include chemical vapor deposition (CVD), plasma enhanced chemical vapor deposition (PECVD) or physical vapor deposition (PVD). Following the deposition of the material that provides each sacrificial spacer 20, the deposited material is subjected to a spacer etch such as, for example, reactive ion etching.

Referring now to FIG. 4, there is illustrated the exemplary semiconductor structure of FIG. 3 after etching the exposed reduced thickness portion of the semiconductor PTS doping layer 12X to provide a semiconductor fin base 12B having a second width, w2, that is greater than the first width, w1, utilizing each sacrificial spacer 20, each semiconductor fin stack (12P, 14P, 16P) and, if present, each hard mask cap 18P as an etch mask. The remaining reduced thickness portion of the semiconductor PTS doping layer 12X can be referred to herein as a base semiconductor PTS doping layer 12Y. The base semiconductor PTS doping layer 12Y has a thickness that is less than the thickness of reduced thickness portion of the semiconductor PTS doping layer 12X. The exemplary semiconductor structure shown in FIG. 4 can be formed utilizing an anisotropic etching process such as, for example, reactive ion etching.

As is shown, the second width, w2, of the semiconductor fin base 12B is equal to the first width, w1, of the semiconductor fin stack (12P, 14P, 16P) plus the width of each sacrificial spacer 20 that is present on the vertical sidewalls of the semiconductor fin stack. In one embodiment of the present application, the second width, w2, of the semiconductor fin base 12B is from 2 nm to 15 nm. In another embodiment of the present application, the second width, w2, of the semiconductor fin base 12B is from 2 nm to 10 nm.

It is noted that the base semiconductor PTS doping layer 12Y, the semiconductor fin base 12B and the semiconductor PTS doping layer portion 12P provide a contiguous structure that is composed of the same material as the original semiconductor PTS doping layer 12L. Thus, there is no material interface present either between the base semiconductor PTS doping layer 12Y and the semiconductor fin base 12B or the semiconductor fin base 12B and the semiconductor PTS doping layer portion 12P.

Figure 5:
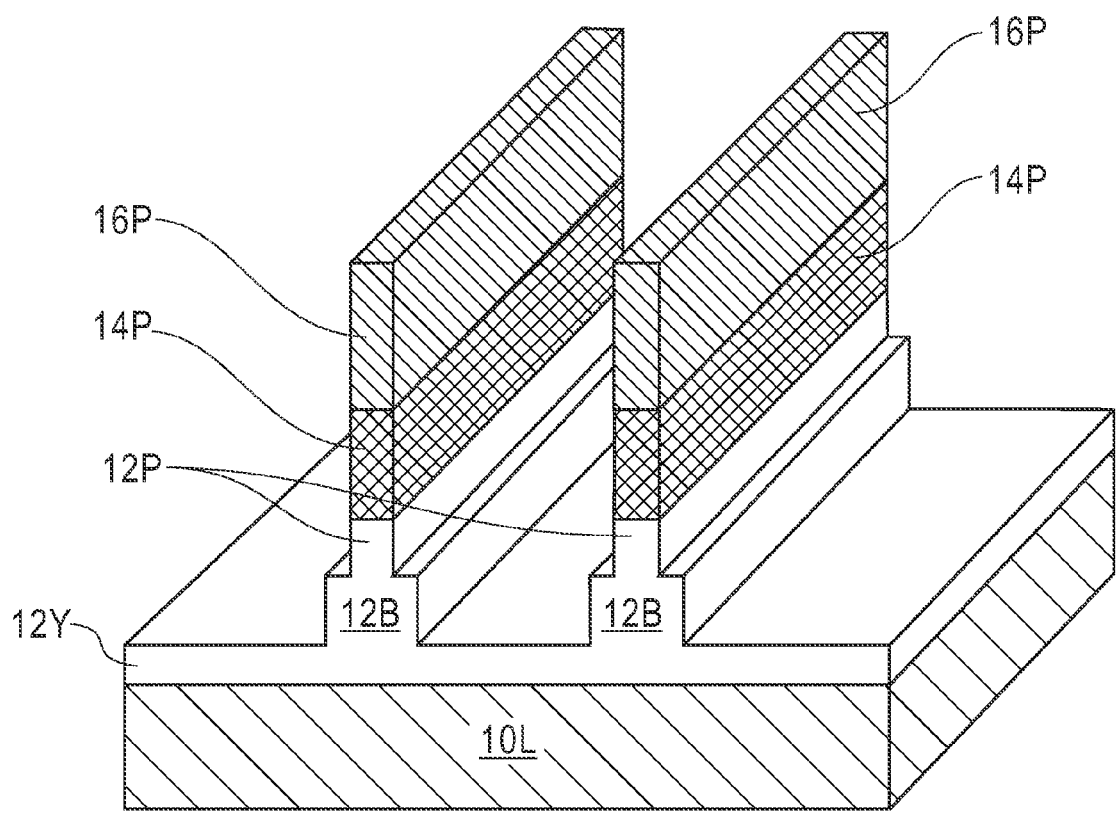
FIG. 5 is a three dimensional view of the exemplary semiconductor structure of FIG. 4 after removing each sacrificial spacer.

Referring now to FIG. 5, there is illustrated the exemplary semiconductor structure of FIG. 4 after removing each sacrificial spacer 20. If present, each hard mask cap 18P can also be removed at this point of the present application. In one embodiment, each sacrificial spacer 20 and each hard mask cap 18P can be removed at the same time utilizing a same etching process. In another embodiment, each hard mask cap 18P can be removed prior to, or after, removing each sacrificial spacer 20. In such an embodiment, separate etching processes can be used to remove each sacrificial spacer 20 and each hard mask cap 18P. In some embodiments, and following the sacrificial spacer 20 removal, each hard mask cap 18P can be removed utilizing a planarization process such as, for example, chemical mechanical planarization.

Figure 6:
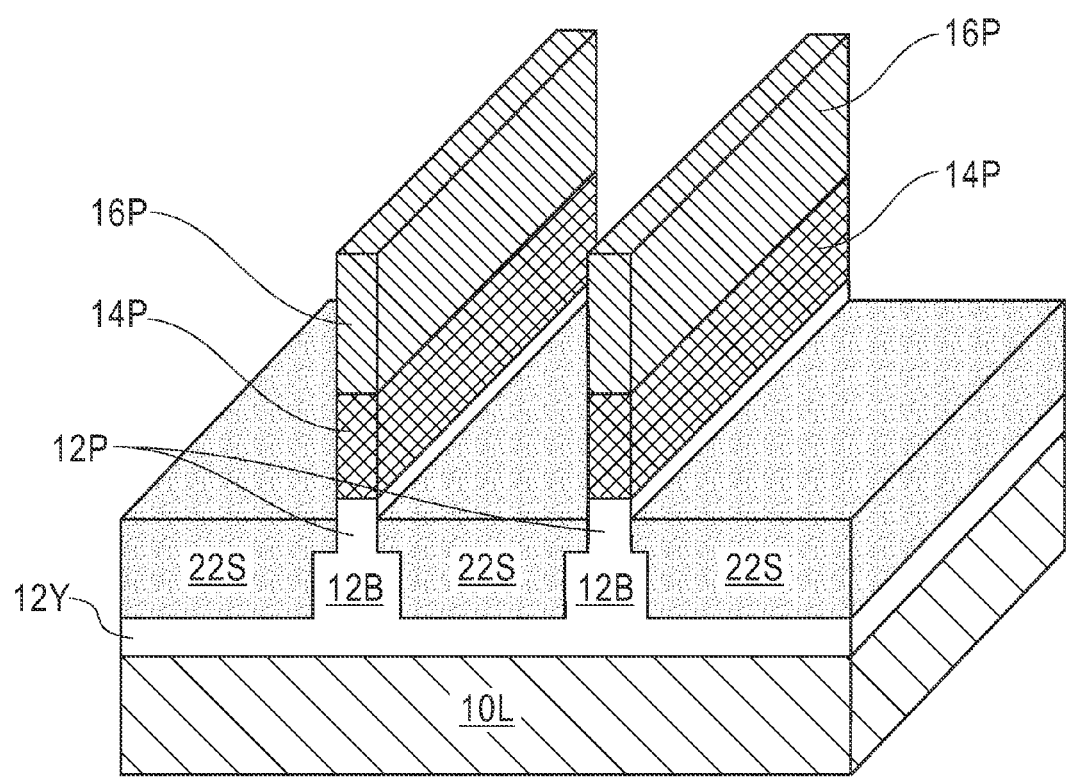
FIG. 6 is a three dimensional view of the exemplary semiconductor structure of FIG. 5 after forming dielectric isolation structures on remaining exposed portions of reduced thickness portions of the semiconductor PTS doping layer.

Referring now to FIG. 6, there is illustrated the exemplary semiconductor structure of FIG. 5 after forming dielectric isolation structures 22S on the exposed surface of base semiconductor PTS doping layer 12Y. As is shown, each dielectric isolation structure 22S that is formed has a topmost surface that is present between the topmost surface of the semiconductor PTS doping layer portion 12P and the semiconductor fin base 12B. As is further shown, the dielectric isolation structures 22S cover an entirety of each semiconductor fin base 12B.

The dielectric isolation structures 22S can be formed by first depositing a dielectric isolation material such as, for example, silicon dioxide, on the exposed surfaces of the base semiconductor PTS doping layer 12Y. In some embodiments, the dielectric isolation material that provides the dielectric isolation structures 22S completely fills each gap that is present between each semiconductor fin stack (12P, 14P, 16P). In such an embodiment, a recess etch is then used to provide the dielectric isolation structures 22S shown in FIG. 6. In other embodiments, the dielectric isolation material that provides the dielectric isolation structures 22S partially fills each gap that is present between each semiconductor fin stack (12P, 14P, 16P). In such an embodiment, a recess etch may or may not be used to provide the dielectric isolation structures 22S shown in FIG. 6.

Figure 7:
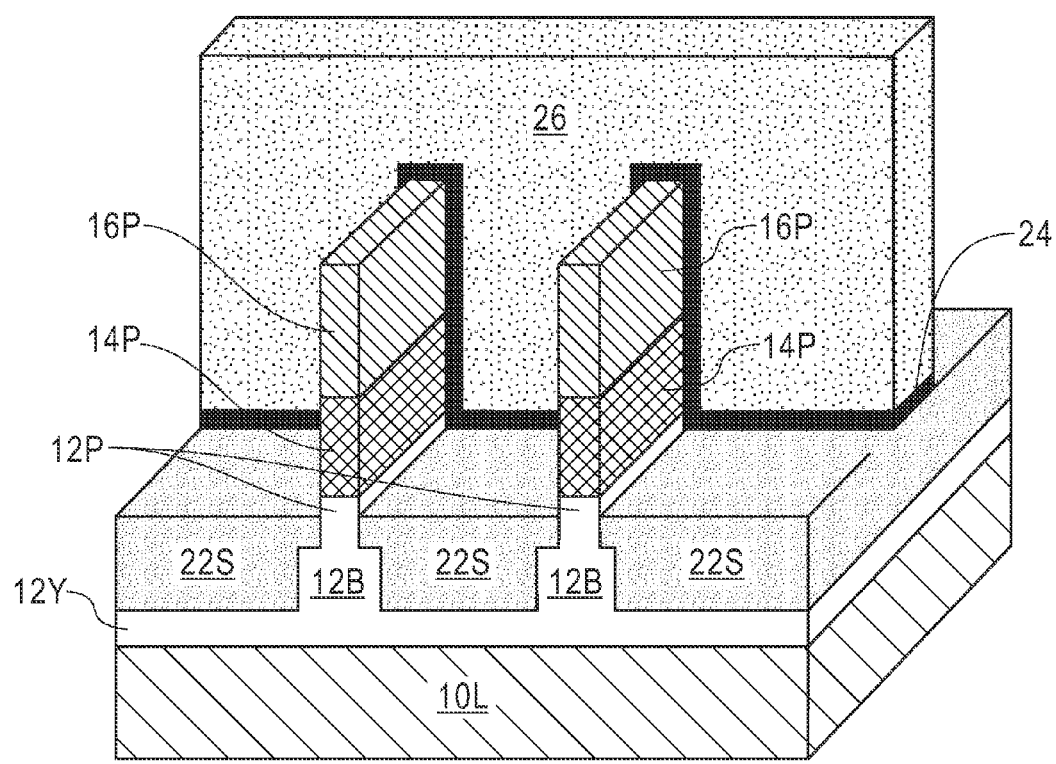
FIG. 7 is a three dimensional view of the exemplary semiconductor structure of FIG. 6 after forming a gate structure straddling each semiconductor fin stack.

Referring now to FIG. 7, there is illustrated the exemplary semiconductor structure of FIG. 6 after forming a gate structure (24, 26) straddling each semiconductor fin stack (12P, 14P, 16P). Although the present application describes and illustrates the formation of a single gate structure, a plurality of gate structures can be formed straddling different portions of each semiconductor fin stack (12P, 14P, 16P). The term "straddling" denotes that the gate structure is formed across a semiconductor fin stack such that a first portion of each gate structure is present on one side of the semiconductor fin stack, and a second portion of each gate structure is present on another side of the semiconductor fin stack. As shown in FIG. 7, a portion of the gate structure (24, 26) is also located on a topmost surface of a portion of each dielectric isolation structure 22S. It is noted that the segment of the topmost semiconductor material layer portion 16P that is protected by the gate structure (24, 26) represents the device channel of the present application.

In some embodiments of the present application, and as shown, the gate structure (24, 26) is a functional gate structure. By "functional gate structure" it is meant a permanent gate structure used to control output current (i.e., flow of carriers in the channel) of a semiconducting device through electrical or magnetic fields. Each functional gate structure that is formed includes a gate material stack of, from bottom to top, a gate dielectric portion 24 and a gate conductor portion 26. In some embodiments, a gate cap portion (not shown) can be present atop the gate conductor portion 26.

The gate dielectric portion 24 comprises a gate dielectric material. The gate dielectric material that provides the gate dielectric portion 24 can be an oxide, nitride, and/or oxynitride. In one example, the gate dielectric material that provides the gate dielectric portion 24 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 24.

The gate dielectric material used in providing the gate dielectric portion 24 can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion 24 comprises a same gate dielectric material. In other embodiments and when multiple functional gate structures are formed, some of the gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion 24 can have a thickness in a range from 1 nm to 10 nm. Other thicknesses that are lesser than, or greater than, the aforementioned thickness range can also be employed for the gate dielectric material.

The gate conductor portion 26 comprises a gate conductor material. The gate conductor material used in providing the gate conductor portion 26 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 26 may comprise an nFET gate metal. In other embodiments, the gate conductor portion 26 may comprise a pFET gate metal. In yet other embodiments and when multiple functional gate structures are formed, some of the gate conductor portions comprise an nFET gate metal, while others gate conductor portions comprise a pFET gate metal.

The gate conductor material used in providing the gate conductor portion 26 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion 26 has a thickness from 1 nm to 100 nm. Other thicknesses that are lesser than, or greater than, the aforementioned thickness range can also be employed for the gate conductor material used in providing the gate conductor portion 26.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, the gate structure is a sacrificial gate structure. By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion 24. The sacrificial gate material portion includes one of the gate conductor materials mentioned above for gate conductor portion 26. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

Figure 8:
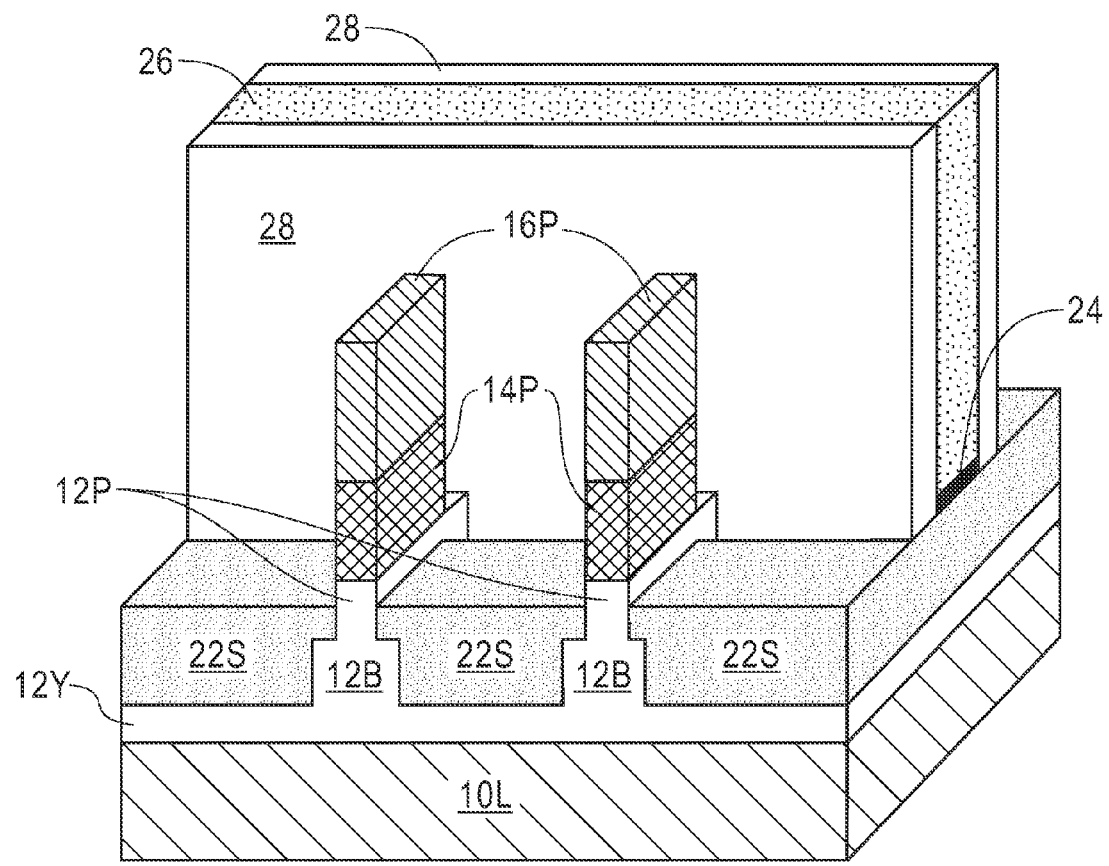
FIG. 8 is a three dimensional view of the exemplary semiconductor structure of FIG. 7 after forming a gate spacer on opposing sidewalls of the gate structure.

Referring now to FIG. 8, there is illustrated the exemplary semiconductor structure of FIG. 7 after forming a gate spacer 28 on opposing sidewalls of the gate structure (24, 26). The gate spacer 28 comprises a gate dielectric spacer material such as, for example, a dielectric oxide, a dielectric nitride and/or a dielectric oxynitride. In one example, each gate spacer 28 comprises silicon dioxide or silicon nitride. Each gate spacer 28 can be formed by first depositing the dielectric spacer material. Illustrative examples of deposition processes that may be used to provide each gate spacer 28 include chemical vapor deposition (CVD), plasma enhanced chemical vapor deposition (PECVD) or physical vapor deposition (PVD). Following the deposition of the dielectric spacer material, the deposited dielectric spacer material is subjected to a spacer etch such as, for example, reactive ion etching. As is shown, the gate spacer 28 straddles other segments of each semiconductor fin stack (12P, 14P, 16P) and has a bottom surface that is located on a topmost surface of a dielectric isolation structure 22S. Each gate spacer 28 is in direct physical contact with a sidewall surface of the gate structure (24, 26) and has a topmost surface that is coplanar with a topmost surface of the gate structure (24, 26).

Figure 9:
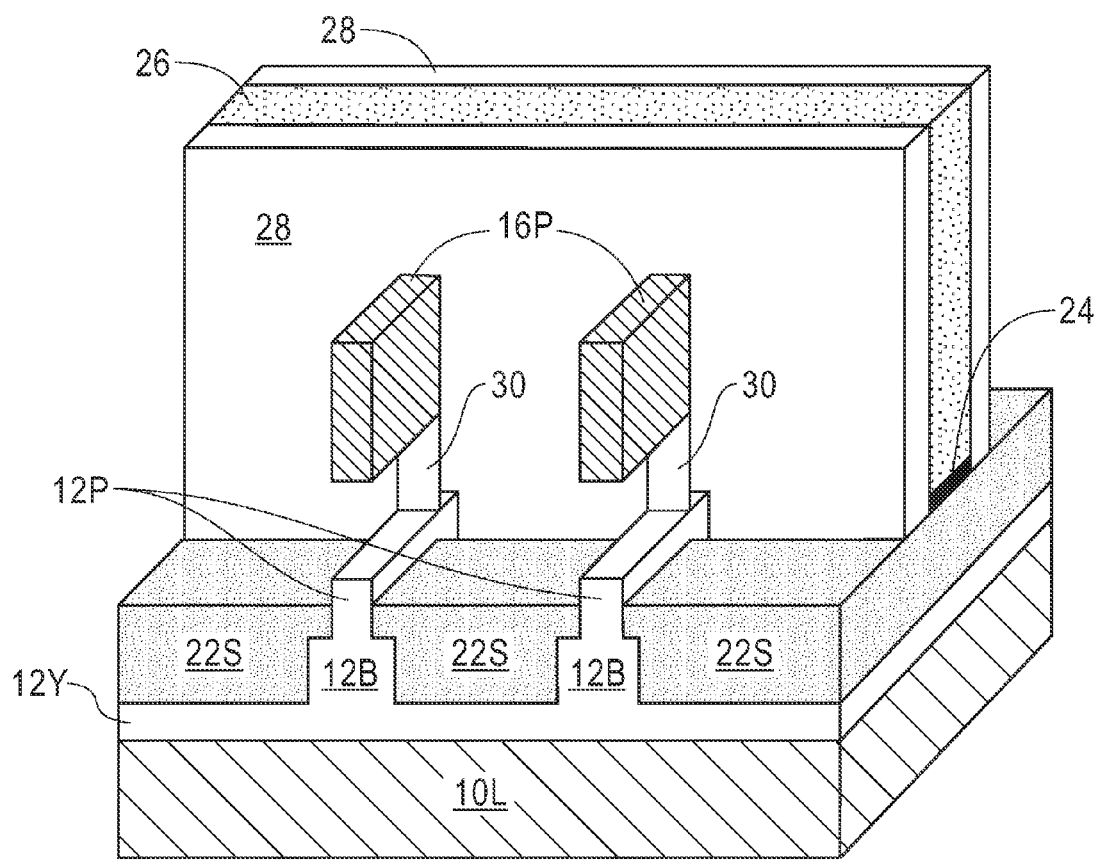
FIG. 9 is a three dimensional view of the exemplary semiconductor structure of FIG. 8 after removing a remaining portion of the sacrificial semiconductor material layer from each semiconductor fin stack to provide a cavity beneath a remaining portion of the topmost semiconductor material layer of each semiconductor fin stack.

Referring now to FIG. 9, there is illustrated the exemplary semiconductor structure of FIG. 8 after entirely removing the sacrificial semiconductor material layer portion 14P from each semiconductor final stack (12P, 14P, 16P) to provide a cavity 30 beneath the topmost semiconductor material layer portion 16P. The sacrificial semiconductor material layer portion 14P can be removed utilizing an etch that selectively removes the third semiconductor material that provides the sacrificial semiconductor material layer 14L relative to the second and fourth semiconductor materials that provided the semiconductor PTS doping layer 12L and the topmost semiconductor material layer 16L, respectively, and relative to the dielectric material that provides the gate dielectric spacer 28 and the dielectric isolation structures 22S. In one example, and when SiGe was used as the third semiconductor material that provided the sacrificial semiconductor material layer 14L and silicon was as the second and fourth semiconductor materials that provided the semiconductor PTS doping layer 12L and the topmost semiconductor material layer 16L, HCl can be used as a chemical etchant to entirely removing the sacrificial semiconductor material layer portion 14P from each semiconductor material stack (12P, 14P, 16P). After entirely removing the sacrificial semiconductor material layer portion 14P from each semiconductor fin stack (12P, 14P, 16P), the topmost semiconductor material layer portion 16P is suspended above the semiconductor PTS doping layer portion 12P of the original semiconductor fin stack. The suspended topmost semiconductor material layer portion 16P is held in place by the gate structure (24, 26) and the gate spacers 28.

Figure 10:
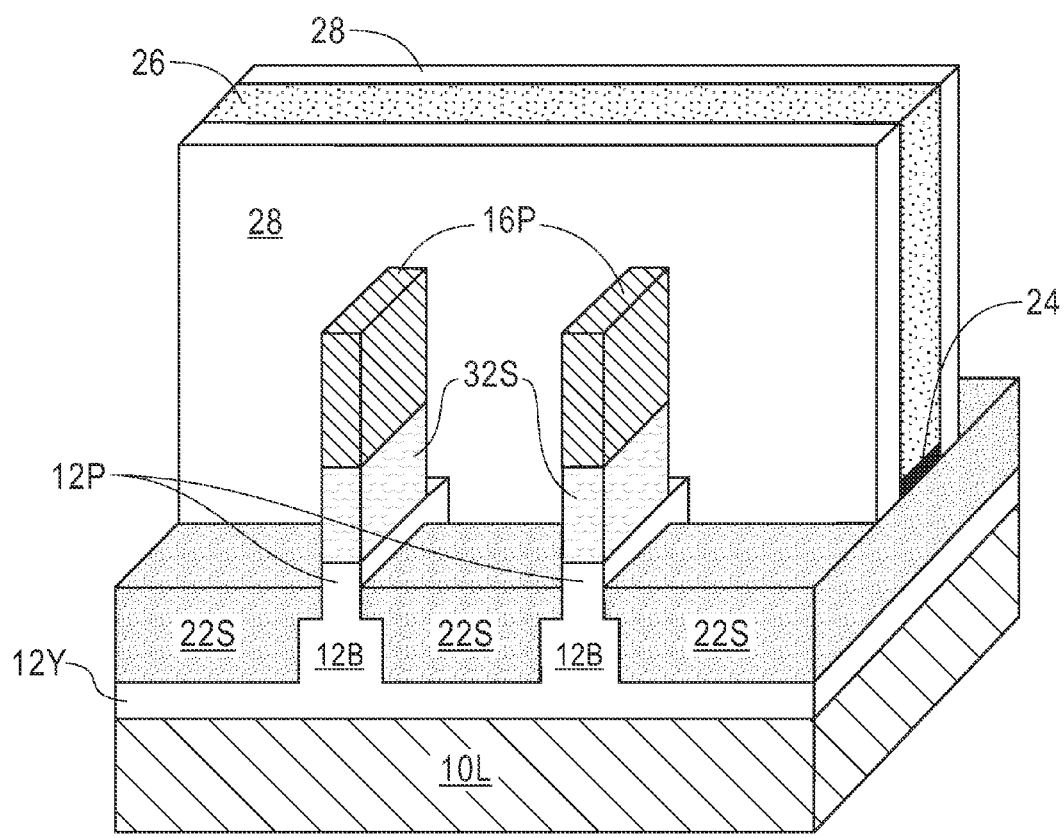
FIG. 10 is a three dimensional view of the exemplary semiconductor structure of FIG. 9 after filling the cavity with a dielectric material to provide a dielectric material structure.

Referring now to FIG. 10, there is illustrated the exemplary semiconductor structure of FIG. 9 after filling the cavity 30 with a dielectric material to provide a dielectric material structure 32S. The dielectric material structure 32S has a topmost surface that directly contacts a bottommost surface of the topmost semiconductor material layer portion 16P and a bottommost surface that directly contacts a topmost surface of the semiconductor PTS doping layer portion 12P. The dielectric material structure 32S may comprise a dielectric oxide, dielectric nitride or dielectric oxynitride. In one embodiment, the dielectric material structure 32S comprises a dielectric oxide such as, for example, silicon dioxide. The dielectric material structure 32S can be formed by a deposition process such as, for example, chemical vapor deposition or plasma enhanced chemical vapor deposition, followed by a recessed etch. The dielectric material structure has a same length and width as that of the topmost semiconductor material layer portion 16P and the semiconductor PTS doping layer portion 12P.

Figure 11:
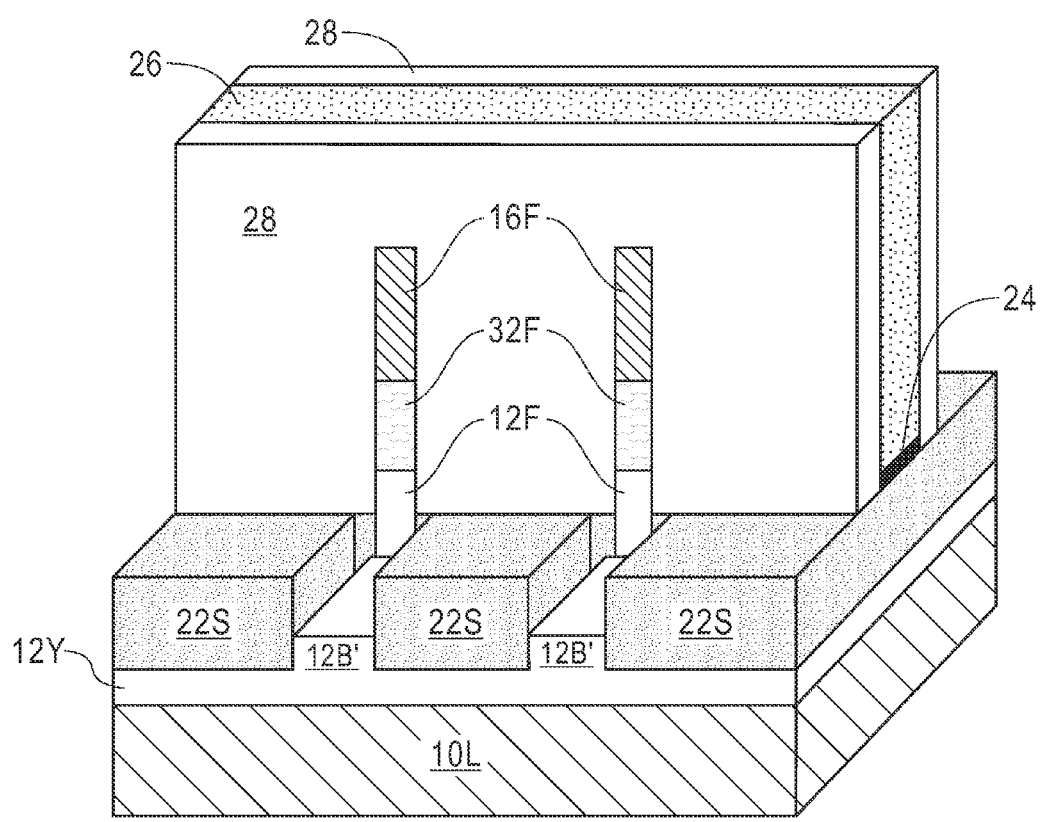
FIG. 11 is a three dimensional view of the exemplary semiconductor structure of FIG. 10 after removing remaining portions of the topmost semiconductor material layer, portions of the dielectric material structure and remaining portions of the semiconductor PTS doping layer that are not protected by either the gate structure or the gate spacers, and performing an optional etch to provide a sigma shape in the channel region.

Referring now to FIG. 11, there is illustrated the exemplary semiconductor structure of FIG. 10 after removing remaining portions of the topmost semiconductor material layer (i.e., topmost semiconductor material layer portion 16P), portions of the dielectric material (i.e., dielectric material structure 32S) and remaining portions of the semiconductor PTS doping layer (i.e., semiconductor PTS doping layer portion 12P) that are not protected by either the gate structure (24, 26) or the gate spacers 28, and performing an optional etch to provide a sigma shape in the channel region. By "sigma shape" it is meant etching into the channel and stopping self-limited in the <111> crystal lattice planes.

The removal of the topmost semiconductor material layer portion 16P, the dielectric material structure 32S, and the semiconductor PTS doping layer portion 12P that are not protected by either the gate structure (24, 26) or the gate spacers 28 is performed utilizing an anisotropic etch such as, for example, reactive ion etching. After performing the anisotropic etch, a portion of the topmost semiconductor material layer portion 16P, a portion of the dielectric material structure 32S, and a portion of the semiconductor PTS doping layer portion 12P that are protected by the gate structure (24, 26) and the gate spacers 28 remain. The remaining portion of the topmost semiconductor material layer portion 16P may be referred to herein as topmost semiconductor fin portion 16F, the remaining portion of the dielectric material structure 32S can be referred to herein as a dielectric material fin portion 32F, and the remaining portion of the semiconductor PTS doping layer portion 12P can be referred to herein as a semiconductor PTS doping fin portion 12F. As is shown, the semiconductor PTS doping fin portion 12F, the dielectric material fin portion 32F, and the topmost semiconductor fin portion 16F are of the first width, w1, and have sidewall surfaces that are vertically coincident to each other and vertically coincident to an outermost sidewall of the gate spacer 28. Collectively, the semiconductor PTS doping fin portion 12F, the dielectric material fin portion 32F, and the topmost semiconductor fin portion 16F provide a fin structure of the present application which is present on a wider semiconductor fin base (i.e., 12B or 12B' as defined below).

In some embodiments (and as shown), the semiconductor fin base 12B can be now be recessed below the topmost surface of each dielectric isolation structure 22S. The recessing of the semiconductor fin base 12B provides a semiconductor fin base portion 12B' whose thickness is less than the thickness of the original semiconductor fin base 12B; the width of the semiconductor fin base portion 12B' is still equal to w2. The recessing of the semiconductor fin base 12B can be performed utilizing another anisotropic etch. In some embodiments, this step of the present application can be omitted.

Figure 12A:
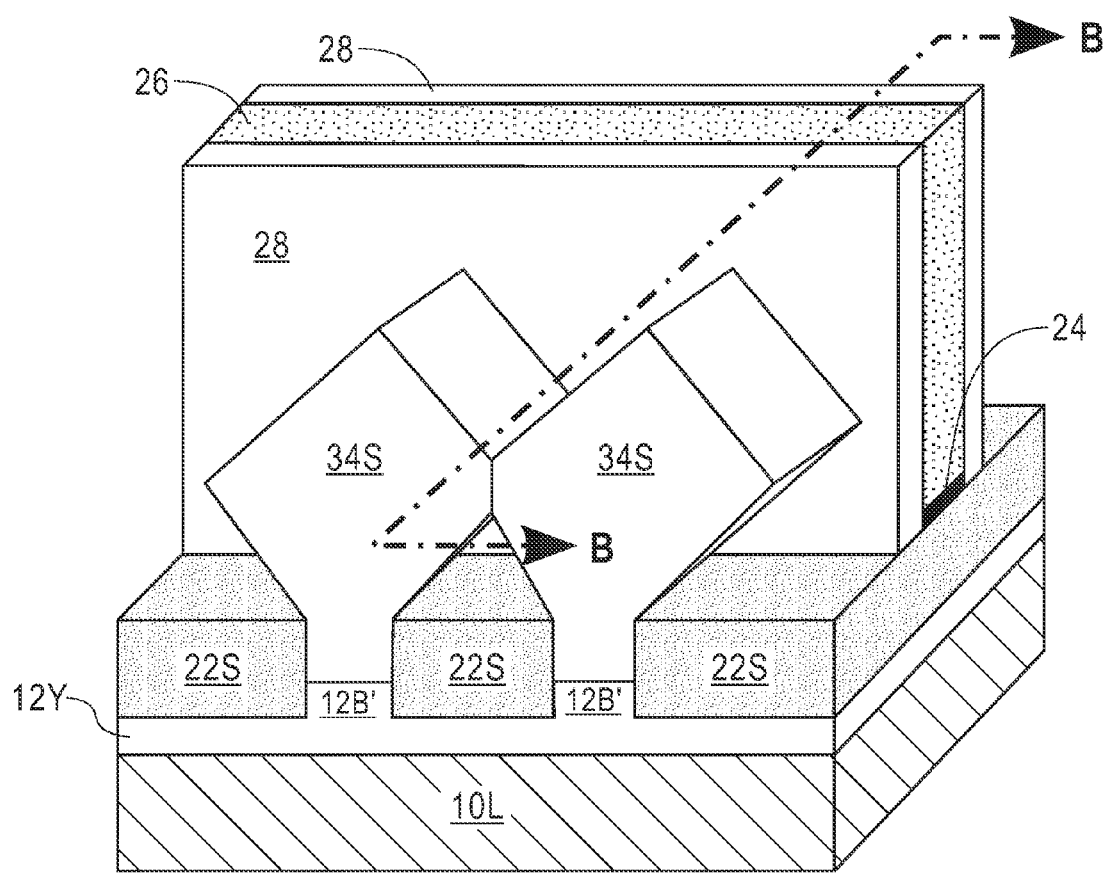
FIG. 12A is a three dimensional view of the exemplary semiconductor structure of FIG. 11 after forming epitaxial source/drain structures from an exposed remaining portion of the semiconductor fin base.
Figure 12B:
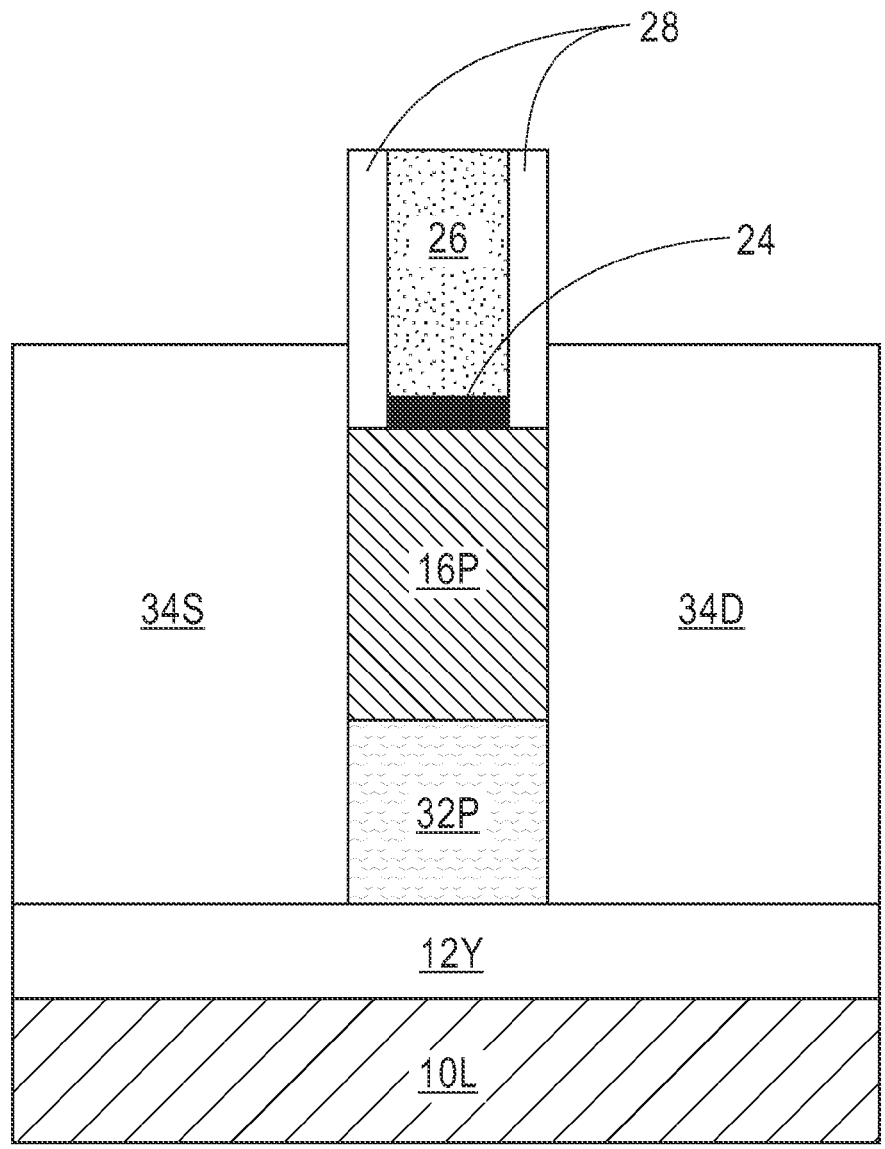
FIG. 12B is a cross sectional view of the exemplary semiconductor structure of FIG. 12A along vertical plane B-B.

Referring now to FIGS. 12A-12B, there is illustrated the exemplary semiconductor structure of FIG. 11 after forming epitaxial source/drain structures (34S, 34D) from an exposed remaining portion of the semiconductor fin base 12B (or semiconductor fin base portion 12B'). In FIG. 12A, only the epitaxial source structures 34S are shown; the epitaxial drain structures 34D would be located on the other side of the gate structure (24, 26).

The epitaxial source/drain structures (34S, 34D) are formed from an exposed surface of the either the semiconductor fin base 12B or the semiconductor fin base portion 12B' utilizing an epitaxial growth process such as that described above. Doping of the epitaxial grown semiconductor material can be performed during the epitaxial growth process itself, or after utilizing gas phase doping. Since an epitaxial growth process is used in forming the epitaxial source/drain structures (34S, 34D), the epitaxial source/drain structures (34S, 34D) have an epitaxial relationship with the underlying semiconductor fin base 12B or semiconductor fin base portion 12B'. In some embodiments and as shown in FIG. 12A, the epitaxial source/drain structures (34S/34D) can merged. In other embodiments (not shown) the epitaxial source/drain structures (34S/34D) can be unmerged. In some embodiments, and as shown, the epitaxial source/drain structures (34S/34D) have a faceted (i.e., non-planar) topmost surface. In some embodiments, the epitaxial source/drain structures (34S/34D) can have a non-faceted (i.e., planar) topmost surface.

The bottom portion of each epitaxial source/drain structure (34S/34D) is wider that the topmost semiconductor fin portion 16F. As such, epitaxial source/drain structures (34S/34D) have improved quality (i.e., less defects) and higher strain than source/drain structure formed in a conventional FinFET processing flow. Also, and as mentioned above, the topmost semiconductor fin portion 16F is above a dielectric material, i.e., dielectric material fin portion 32F, thus the structure of the present application is SOI like. Furthermore, the remaining semiconductor PTS doping material (i.e., layer 12F and 12B or 12B') prevents source/drain shorts.

The epitaxial source/drain structures (34S/34D) comprise a doped (n-type or p-type) semiconductor material. In one embodiment of the present application, the semiconductor material that provides the epitaxial source/drain structures (34S/34D) can be the same as the second semiconductor material that provides the semiconductor PTS doping layer 12L. In one example, the epitaxial source/drain structures (34S/34D) and the semiconductor PTS doping layer 12L can be composed of silicon. In another embodiment of the present application, the semiconductor material that provides the epitaxial source/drain structures (34S/34D) can be different from the second semiconductor material that provides the semiconductor PTS doping layer 12L. In one example, the epitaxial source/drain structures (34S/34D) can be composed of a silicon germanium alloy, while the semiconductor PTS doping layer can be composed of silicon.

A semiconductor structure is provided that includes a fin structure of, from bottom to top, the punch through stop (PTS) doping fin portion 12F, the dielectric material fin portion 32F, and the topmost semiconductor fin portion 16F that is present on a wider semiconductor fin base (i.e., 12B or 12B'). A functional gate structure (24, 26) straddles the semiconductor fin structure. Portions of the wider semiconductor fin base (12B or 12B') that are not located directly beneath the fin structure (12F, 32F, 16F) of the present application and that are not covered by the functional gate structure (24, 26) can be used as an area for epitaxial growth of source/drain structures (34S/34D). The wide semiconductor fin base (12B or 12B') improves source/drain epitaxy for better dopant incorporate and strain enhancement.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    forming a semiconductor fin stack of, from bottom to top, as semiconductor punch through stop (PTS) doping layer portion, a sacrificial semiconductor material layer portion and a topmost semiconductor material layer portion extending upwards from a remaining portion of a semiconductor PTS doping layer, said semiconductor fin stack having a first width;
    forming a sacrificial spacer on opposing sidewall surfaces of said semiconductor fin stack;
    etching said remaining portion of said PTS doping layer to provide a semiconductor fin base of a second width and located beneath said semiconductor fin stack, wherein said second width is greater than said first width;
    removing said sacrificial spacer from said opposing sidewall surfaces of said semiconductor fin stack;
    forming a gate structure straddling said semiconductor fin stack;
    forming a dielectric isolation structure on a reduced thickness portion of said remaining portion of said semiconductor PTS doping layer after said etching of said semiconductor PTS doping layer, said dielectric isolation structure having a topmost surface that is located above a topmost surface of said semiconductor fin base;
    completely removing said sacrificial semiconductor material layer portion of said semiconductor fin stack to provide a cavity;
    filling said cavity with a dielectric material to provide a dielectric material structure;
    removing exposed portions of said topmost semiconductor material layer portion, said dielectric material structure and said PTS doping layer to provide a fin structure of said first width; and
    epitaxially growing an epitaxial source structure on exposed portions of said semiconductor fin base and on a first side of said functional gate structure, and an epitaxial drain structure on exposed portions of said semiconductor fin base and on a second side of said functional gate structure which is opposite said first side of said functional gate structure, wherein prior to said epitaxial growing said epitaxial source structure and said epitaxial drain structure, said semiconductor fin base is recessed below the height of said dielectric isolation structure.

2. The method of claim 1, wherein said semiconductor punch through stop (PTS) doping layer portion, and said topmost semiconductor material layer portion comprise silicon, and said sacrificial semiconductor material layer portion comprises a silicon germanium alloy.

3. The method of claim 1, wherein said gate structure is a functional gate structure comprising a gate dielectric portion and a gate conductor portion.

4. The method of claim 1, wherein said gate structure is a sacrificial gate structure and said sacrificial gate structure is replaced with a functional gate structure after said epitaxially growing said epitaxial source structure and said epitaxial drain structure.

5. The method of claim 1, wherein said forming a semiconductor fin stack comprising:
   providing a structure including, from bottom to top, a semiconductor substrate, said semiconductor PTS doping layer, a sacrificial semiconductor material layer and a topmost semiconductor material layer; and
   patterning said topmost semiconductor material layer, said sacrificial semiconductor material layer and a portion of said semiconductor PTS doping layer, wherein said patterning comprises a sidewall image transfer process or lithography and etching.

6. The method of claim 1, wherein prior to said removing said exposed portions of said topmost semiconductor material layer portion, said dielectric material structure and said semiconductor PTS doping layer to provide said fin structure of said first width, a gate spacer is formed on opposing sidewall surfaces of said gate structure.

7. The method of claim 1, wherein said etching said remaining portion of said semiconductor PTS doping layer to provide said semiconductor fin base of said second width comprises an anisotropic etch.

\* \* \* \* \*